United States Patent [19]

Atsushi

[11] Patent Number: 5,340,604
[45] Date of Patent: Aug. 23, 1994

[54] METHOD FOR MANUFACTURING A COMPOSITE VAPOR DEPOSITION FILM

[76] Inventor: Ogura Atsushi, 2-14-30, Yukinoshita, Kamakura, Kanagawa, Japan

[21] Appl. No.: 675,753

[22] Filed: Mar. 22, 1991

[30] Foreign Application Priority Data

Mar. 30, 1990 [JP] Japan .................. 2-80691
Nov. 27, 1990 [JP] Japan .................. 2-320689

[51] Int. Cl.$^5$ ............................. B05D 3/06
[52] U.S. Cl. .................. 427/10; 427/255.2; 427/294; 427/346; 427/374.1; 427/398.1; 427/446; 427/561; 427/565; 427/585; 427/586; 427/587
[58] Field of Search ........... 427/38, 53.1, 374.1, 427/255.2, 561, 565, 569, 585, 587, 398.1, 294, 446, 586, 346, 10

[56] References Cited

U.S. PATENT DOCUMENTS 4,952,463 8/1990 Atushi .................. 428/552

FOREIGN PATENT DOCUMENTS

0209972A1 5/1986 European Pat. Off. .
0245716A1 4/1987 European Pat. Off. .
0452006A3 3/1991 European Pat. Off. .
59-121917 12/1982 Japan .
63-42377 2/1986 Japan .
1-249625 10/1989 Japan .

OTHER PUBLICATIONS

Gerard Blandenet et al., "Thin Layers Deposited by the Pyrosol Process", *Thin Solid Films*, 77:81–90 (1981).

*Primary Examiner*—Bernard Pianalto
*Attorney, Agent, or Firm*—Darby & Darby

[57] ABSTRACT

This invention relates to a composite vapor deposition film composed of a plurality of elements and a method for manufacturing the same. A composite vapor deposition film is produced by having a composite of multi-component particles turned into a vapor to instantaneously evaporate the multi-component particles to an energy active vapor phase state. The composite vapor phase substance is solidified on a deposition substrate to form the vapor deposition film.

17 Claims, 3 Drawing Sheets

METHOD FOR MANUFACTURING A COMPOSITE VAPOR DEPOSITION FILM

BACKGROUND OF THE INVENTION

This invention relates to a composite vapor deposition film composed of a plurality of elements and to the method for manufacturing the same.

DESCRIPTION OF THE PRIOR ART

Conventionally, vapor deposition film has been manufactured by a method in which multi-component particles used as raw materials are heated in a high temperature furnace, and a vapor deposition film is obtained by heating and evaporating the particles. Another conventional method is a sputtering method in which a metal vapor deposition film is obtained by depositing clusters of metallic ions, of a target substance on a deposition substrate.

In the heating and evaporating method, the multi-component particles used as raw materials have different evaporation points. Thus, the component having the lower evaporating point is evaporated at first. Therefore, it is difficult to evaporate the multi-component substances at the same time to obtain a uniform evaporation film. A material having only one component may be used to allow a single time for evaporation. However, if only one component is used, an evaporation film having only one component will be obtained.

In the sputtering method, a target material having one component is used. Typically, the target material is a metal substance. The substrate is radiated and only the metal ion having one component is released. As a result, the evaporation film is formed only by the metal substance and has only one component. Therefore, it has been impossible to obtain a synthesized vapor deposition film, in which multi-component elements are uniformly present. For this reason, the vapor deposition film of the conventional type has been mostly limited to metal substances, and has not obtained a multi-component vapor deposition film oxygen compound. Accordingly, there has been no application of the conventional vapor deposition film as a ceramic vapor deposition film.

SUMMARY OF THE INVENTION

In general, the object of the present invention is to provide a composite vapor deposition film, having such structure that at least two or more types of elements are combined in a multi-component composite synthesis in the order of molecules or atoms and to provide a method for manufacturing such substance.

According to the present invention, an aqueous solution of a composite complex salt containing at least two or more types of elements or ions, other than water, is reduced by alkali reduction with caustic soda or an aqueous solution of ammonia of the like. The multi-component composite particles thus obtained are reacted to an ion active state by high temperature plasma in a high density active energy state to obtain a multi-component vapor deposition film, in which substances are contained in a multi-component composite synthesized form in the order of the elements or molecules.

According to this invention, multi-component composite particles containing at least two or more types of elements other than water are turned into an ion active composite vapor phase by high temperature plasma in high density active energy state, and a multi-component composite vapor deposition film can be obtained, in which the two or more types of elements are uniformly combined in the order of atoms and/or molecules. In this case, the component blending ratio of the multi-component composite particles and the mixing ratio of the multi-component composite particles with the quantity of the gas which is used can be selected arbitrarily to produce a multi-component composite vapor deposition film having a desired component ratio. By this method, it is possible to obtain a vapor deposition film, which is physically strong and resistant to deterioration and which can be used, for example, as film for a storage element such as magnetic thin film, light-reactive thin film, or film for various types of sensors such as oxide thin film.

DETAILED DESCRIPTION

Figure 1:
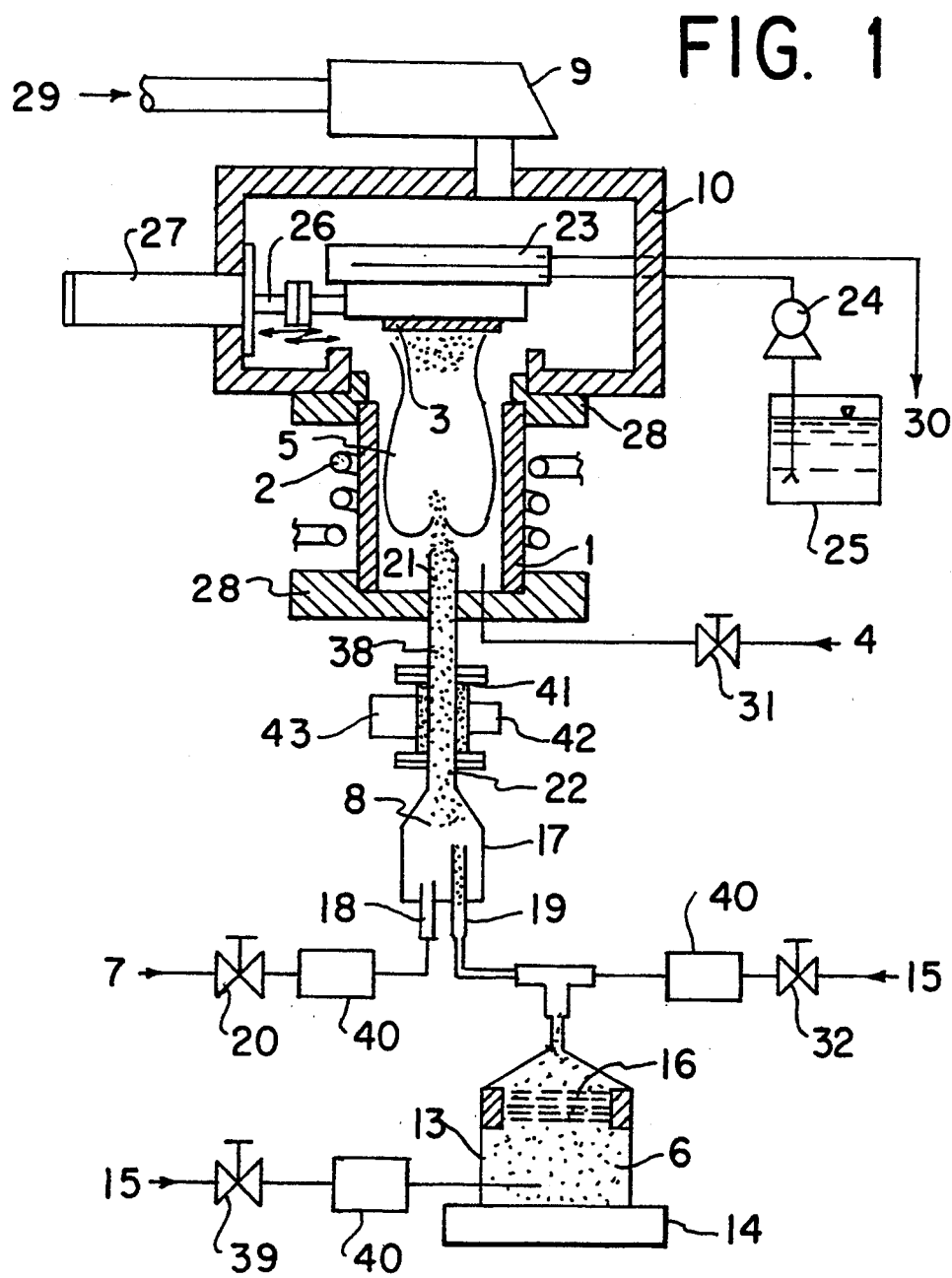
FIG. 1 is a schematic diagram of the process according to the present invention.

In a first embodiment, to an aqueous solution of multi-component complex salt containing 3 component ions of iron (Fe), nickel (Ni) and aluminum (Al), an aqueous solution of caustic soda (NaOH) is mixed. By alkali reduction, a sludge of composite synthesized oxide particles containing the 3 components of iron (Fe), nickel (Ni) and aluminum (Al) is obtained. After removing the salt component by washing the sludge with water, it is dried by a spray dryer, and the multi-component composite synthesized particles are collected after secondary granulation. The composite is then sent into a high temperature plasma in high density energy active state, generated by a glass tube torch using argon gas and nitrogen gas. The multi-component composite synthesized particles are turned into a vapor phase by instantaneously evaporating to an energy active vapor phase state. This composite vapor phase substance is injected on the surface of a deposition substrate, such as a quartz glass substrate; placed in a reduced pressure chamber under reduced pressure condition preferably, about 60 mmHg; and cooled through a temperature difference from the temperature of the substrate itself, and a multi-component composite synthetic film such as a 3-component composite magnetic oxide film, is obtained on the surface of the substrate.

The composite vapor deposition film thus obtained by composite synthesizing of Fe, Ni and Al components with oxygen in the order of molecules is crystallized as a multi-component composite oxide film.

When the composite vapor deposition film thus obtained was analyzed by x-ray analysis, the results of the analysis revealed that the component ratio was the same as that the ratio of the multi-component composite particles used as raw materials.

When the deposit position of the deposition substrate was shifted toward the tip of the plasma flame, a vapor deposition film with spherical particles was obtained.

In contrast to the conventional methods, it was extremely difficult in conventional methods to produce multi-component composite vapor deposition film by evaporating multi-component substance at the same time under the same conditions, whereas it is possible according to the present invention to produce high density composite vapor deposition film containing multiple components at the same time under the same conditions and uniformly in the order of molecules and/or composite vapor deposition film with spherical particles through composite synthesizing in the order of molecules.

In a second embodiment, a multi-component composite oxide particles containing Ni, Al and Cr were mixed with argon gas, and this mixture was turned to a composite vapor phase substance in a plasma state through instantaneous evaporation by sending the multi-component composite into a high temperature plasma of high density energy active vapor phase generated in a glass tube torch, using high frequency electric power, argon gas and nitrogen gas. This composite vapor phase substance was injected on the surface of the deposition substrate installed in a reduced pressure chamber under the reduced condition, as described above. By cooling and solidifying it by the temperature difference from the temperature of the deposition substrate itself, a multi-component composite deposition film was obtained on the surface of the deposition substrate.

The composite vapor deposition film thus obtained is a multi-component composite oxide film where Ni, Al and Cr are uniformly combined and synthesized in the order of molecules.

When the composite vapor deposition film thus produced was analyzed by x-ray analysis, the results of the analysis revealed that the component ratio was the same as that of the multi-component composite particles used as raw materials.

As is evident from the description of the above embodiments, the composite vapor deposition film according to the present invention is a multi-component composite oxide vapor deposition film not similar to the conventional type single component vapor deposition films. Examples of raw materials are metal alloy powders, semi-oxide or alloys mixed with water or plasma atomizing powders. By arbitrarily selecting the type of components as raw materials or the blending ratio of the components, the substance formed can be applied, for example, to various industrial measurements, various storage elements, various electronic semiconductor elements, etc. or as magnetic substance, light reactive magnetic material, electrical semiconductor, electrical insulating material, etc. Further, it will be appreciated that other uses for a composite vapor deposition film are known in the art.

FIG. 1 shows the manufacturing process to deposit multi-component composite particles on a substrate.

In the process, an aqueous solution of composite complex salt containing at least two or more type of elements (ions) other than water is reduced by alkali reduction to crystallize various elements (ions) (not shown). After the salt component and moisture are removed to produce a raw material powder, the raw material powder of multi-component composite particles 6 are placed in a container 13. A vibrator 14 is provided on an external side of the container and a filter 16 is furnished on a discharge side of the container. In the bottom portion of the container 13, argon gas 15 may be introduced to the container. The flow rate of the argon gas 15 is adjusted by valve 39. The argon gas may be heated by a heater 40. The argon gas is introduced to the container and the container 13 may be vibrated with the vibrator 14. By vibrating the container, the raw material powder of multi-component composite particles 6 in the container 13 is moved, lifted and floated. Only the portion of the raw material particle powder 6 having a particle size of 3 µm or less is passed through filter 16, and a mixture 8 of the portion of the raw material with a particle size of 3 µm and argon gas with argon gas 15 in obtained. This mixture 8 is blended with argon gas 15, which was heated by heater 40 and was adjusted by the valve 32. The mixture 8 is sent into mixer 17 through the inlet 19. In mixer 17, the mixture 8 is mixed with the gas 7, preferably, argon gas and/or ammonia gas. The gas is sent from the inlet 18 after being adjusted by the valve 20 and being heated by the heater 40. The mixing ratio may be detected by photosensor 42 installed on the pipe 41 or may be detected by measuring the quantity of multi-component composite particles 6 with static measuring instruments 43. In response to the detected mixing ratio, the feeding quantity of the gas 7 may be adjusted by the valve 20, to thereby adjust the mixing ratio of the multi-component composite particle powder 6. The mixture 8 thus adjusted is passed through the pipe 41 from the discharge outlet 22 of the mixer 17 and is sent from discharge nozzle 38 to nozzle 21 of the high frequency torch into the cylindrical glass tube 1. A gas substance 4 such as argon and/or nitrogen may be introduced into the cylindrical glass tube 1. By applying high frequency current on a coil 2 wound on the glass tube 1, the ions of the gas substance 4 by inductance generated by the coil 2, are turned into an energy active state, and a high temperature plasma 5 is obtained.

By this high temperature plasma 5, multi-component composite particles 6 in the mixture 8 are simultaneously evaporated in energy active vapor phase state and composite vapor phase substance 12 is obtained. This composite vapor phase substance 12 is dispersed and sprayed on the surface of the deposition substrate 11 installed in a reduced pressure chamber 10 with the pressure reduced, preferably to about 60 mmHg, by a vacuum pump 9. Then, it is indirectly cooled by a cooling jig 23 cooled with cooling water, and said composite vapor phase substance 12 is vapor-deposited on the surface of the deposition substrate 11. The substrate is cooled to solidify the deposited substance 12 and a multi-component composite vapor deposition film 3 in solid phase is formed.

Figure 2:
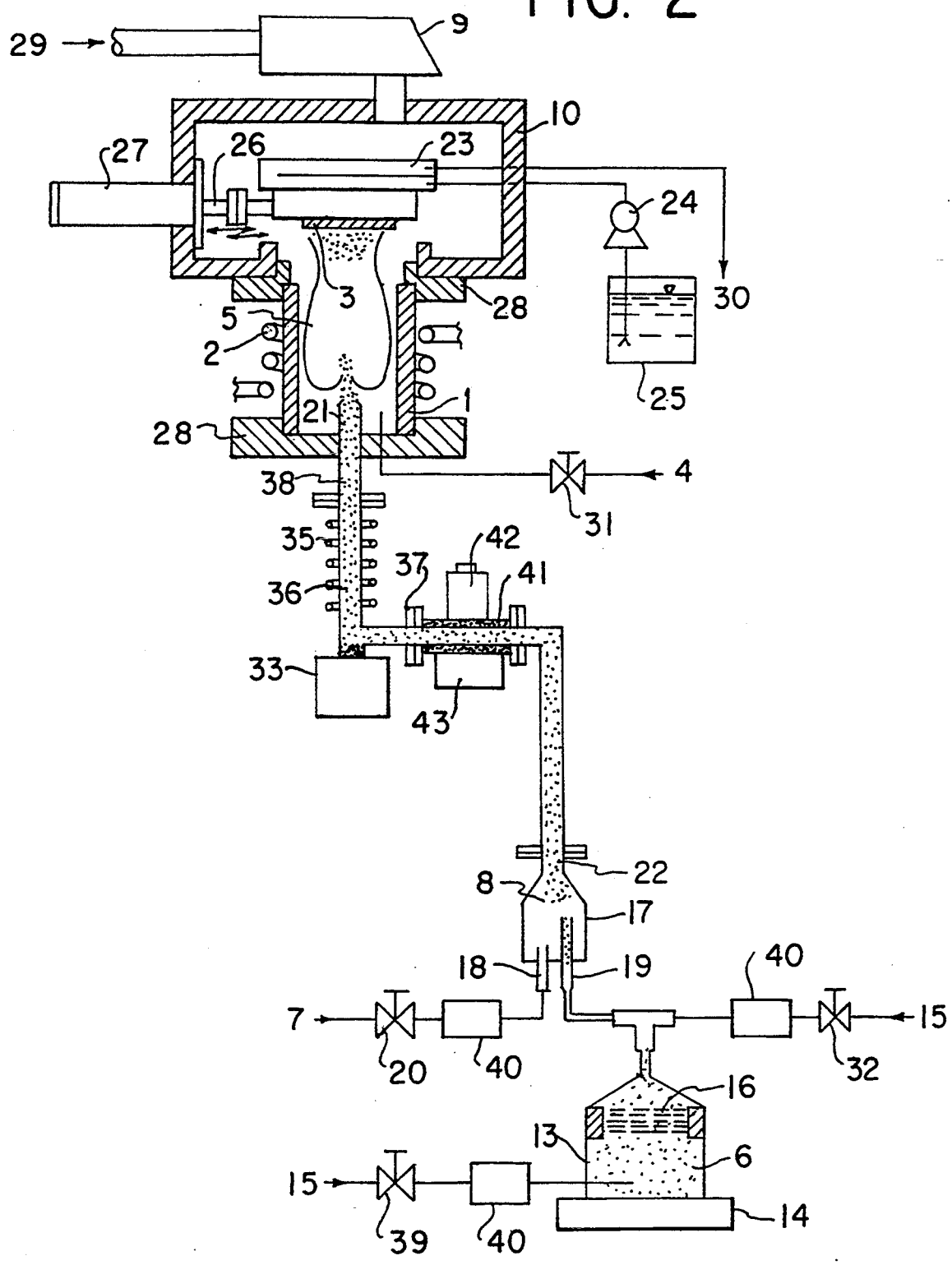
FIG. 2 is a schematic diagram of the process according to the present invention.

In another embodiment, as shown in FIG. 2, the same steps are performed to produce the mixture 8. Mixture 8 is then inserted into the subjection port 37 of a laser guide tube 36. The laser guide tube 36 is provided with a laser generator 33 before the nozzle 21 of the high frequency plasma torch. An undulator coil 33 is wound on the outside of the laser guide tube 36. Thus, the multi-component composite particles 6 contained in the mixture 8 are turned to a high temperature condition by laser energy. The mixture is then sent into a cylindrical glass tube 1 through the nozzle 21 of the high frequency plasma torch from discharge nozzle 38. By connecting high frequency current on the coil 2 wound on the glass tube 1, the ions of gas substance 4 simultaneously passed into the glass tube 1, by inductance generated by said coil 2, are turned to energy active state, and high temperature plasma 5 is obtained. By this high temperature plasma, multi-component composite particles 6 in the mixture 8 are simultaneously evaporated in energy active vapor phase state, and composite vapor phase substance 12 is obtained. This composite vapor phase substance 12 is dispersed and sprayed on the surface of the deposition substrate 11 installed in a reduced pressure chamber 10, as described above, and is cooled in the manner described above to form a multi-component composite vapor deposition film 3. Then, it is indirectly cooled by a cooling jig 23 cooled with cooling water, and said composite vapor phase substance 12 is vapor-deposited on the surface of the deposition substrate 11. This substance 12 is cooled and solidified and a multi-component composite vapor deposition film 3 in solid phase according to this invention is obtained.

Figure 3:
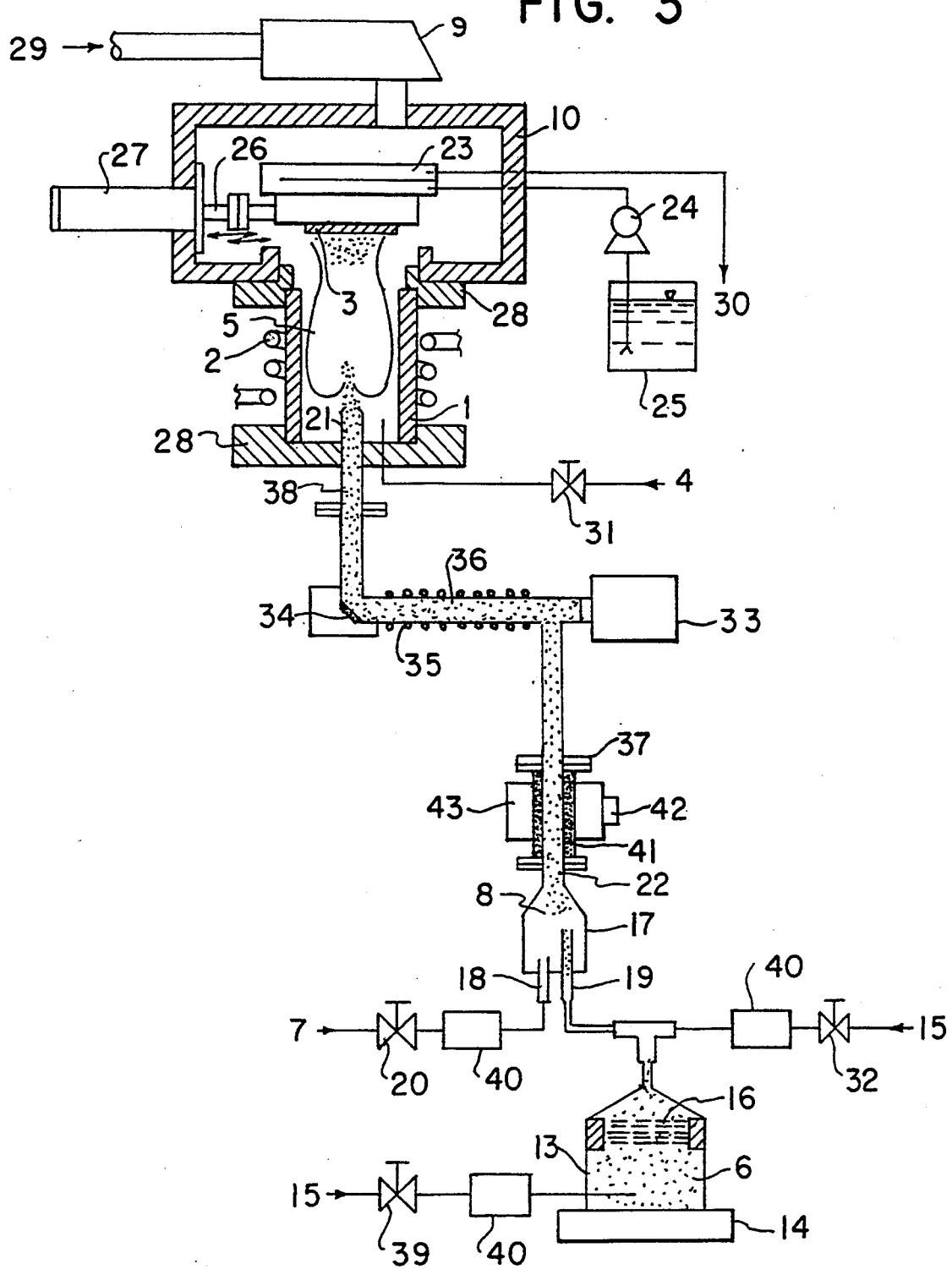
FIG. 3 is a schematic diagram of the process according to the present invention.

In another embodiment, a laser guide tube 36 is placed horizontally as shown in FIG. 3. A laser reflection plate 34 is installed with the reflection plate 34 on the forward end of the laser guide tube 36. By reflecting the laser beam at a right angle, the mixture 8 at high temperature mixed with multi-component composite particles 6 is sent through discharge nozzle 38. Thus uniform multi-component composite vapor deposition film can also be obtained by this procedure. It is possible according to the present invention to obtain multi-component composite film such as oxide film and/or nitrogen compound film and/or composite film of metal and oxide containing multiple components at the same time which has been difficult to produce in the past. The blending ratio for each application purpose can be arbitrarily selected. The product according to the present invention has multiple function electronically, optically and magnetically and there are many uses for the application of this film in electronics industry.

I claim:

1. A method for preparing a composite vapor depositions film comprising the steps of:
   reducing by alkali reduction an aqueous solution of a composite complex salt comprising at least two different ions and a salt component;
   removing from said ions said composite salt component and the moisture of said aqueous solution;
   evaporating with thermal energy of high temperature plasma energy in high density active energy state said ions to form a composite vapor phase substance of said ions;
   depositing said composite vapor phase substance of said ions on a deposition substrate; and
   cooling said deposited composite vapor phase substance of said ions, thereby producing said composite vapor deposition film.

2. A method according to claim 1 wherein in said evaporating step said high temperature plasma in high density energy active state is produced through ion activation of one or more gas substances selected from the group consisting of helium gas or argon gas passed simultaneously into a glass tube having a coil wrapped around said tube with inductance from a high frequency current passed to said coil.

3. A method for manufacturing composite vapor deposition film according to claim 2, where in said argon gas introduced is heated by a heater.

4. A method for manufacturing composite vapor deposition film according to claim 2, wherein a photosensor is provided at the center of an outer cylindrical surface of said glass tube between said container and said mixer, a light emitting source is provided on the outer cylindrical surface of glass pipe placed face-to-face to said photosensor, and the mixing quantity of gas is adjusted and controlled by measuring the quantity of multi-component composite particles passing therethrough.

5. A method according to claim 1, wherein after said removing step said crystallized ions are mixed with argon gas and this mixture is further mixed with one or more of the gases selected from the consisting helium gas, argon gas, ammonia gas, oxygen gas or hydrogen gas.

6. A method of claim 1 wherein said depositing step comprises introducing said vapor phase substance to a chamber under reduced pressure in which said deposition film is positioned.

7. A method according to claim 1, wherein said evaporating step comprises using a high frequency plasma torch having a plasma flame, said high frequency torch being positioned so that said plasma flame is blown upward from below, and that said ions blow upward into said high temperature plasma flame from a nozzle provided on the lower portion of said high frequency plasma torch.

8. A method for manufacturing composite vapor deposition film according to claim 1, wherein after said removing step said crystallized ions are fed to a container, said container is vibrated by a vibrator mounted on the outside of said container, thereby said ions in the container are moved, lifted and floated by introducing argon gas into said container, so that multi-component composite particles of said ions having a particle size of 3 $\mu$m or less are passed through a filter installed at the discharge outlet of the container, said argon gas and said multi-component composite particles are sent through one of the inlets of the mixer having two inlets and one outlet, at said outlet one or more gas substances selected from the group consisting of argon gas, argon gas and ammonia gas, argon gas and oxygen, are added by an adjusting valve, the mixing of the quantity of said multi-component composite particles is controlled by adjusting and controlling the mixing ratio of said gas of said mixture and said multi-component composite particles so that the component ratio of said composite vapor deposition film is thereby controlled.

9. A method for manufacturing composite vapor deposition film according to claim 1, wherein after the step of removing said ions from said salt component, said ions are processed by a high temperature plasma evaporation atomizing method to produce multi-component composite solution particles to be used as raw materials.

10. A method for manufacturing composite vapor deposition film according to claim 1, wherein composite complex salt aqueous solution containing at least two types or more of ions other than water is evaporated together with water through high frequency vibration, and multi-component mixed and evaporated liquid particles thus obtained is mixed with argon gas and is used as raw materials.

11. A method for manufacturing composite vapor evaporation film according to claim 1, wherein composite complex salt aqueous solution containing at least two types or more of ions other than water is reduced by alkali by alkali reduction to crystallize said ions, the multi-component composite particles after removing salt component and moisture are mixed with aqueous solution containing water and/or the component other than water, this multi-component mixture is mixed with gas, and the mixture of solid, liquid and gas is used as raw material.

12. A method for manufacturing composite vapor deposition film according to claim 1, wherein said evaporating step includes a filter formed in the shape of a plane, cylinder or bag from a material comprising paper, ceramic, plastic, metal, or a composite material.

13. A method for manufacturing composite vapor deposition film according to claim 1, wherein said vapor phase substance is supplied in a mixing quantity that is adjusted and controlled by measuring the quantity of said ions passing therethrough by use of an electrostatic measuring apparatus.

14. A method for manufacturing composite vapor deposition film, characterized in that a laser beam generated by a laser generator is sent into a guide tube having an undulator coil wound on it having a high frequency plasma torch at one end, a mixture of multi-component composite particles is discharged into said guide tube from a mixer with a gas, said mixture is passed through a nozzle of said high frequency plasma torch, gas being passed through a valve is discharged into said high temperature plasma torch and said mixture is turned to composite vapor phase substance in energy active vapor phase state by high frequency inductance, said composite vapor phase substance being injected into a reduced pressure chamber with the pressure of said chamber being reduced by a vacuum pump and said composite vapor phase substance is uniformly attached on the surface of a deposition substrate by cooling and solidifying, thereby forming a multi-component composite vapor deposition film on the surface of said deposition substrate.

15. A method for manufacturing composite vapor deposition film according to claim 14, where in said laser generator a reflection plate is furnished on the forward end of said laser generator, a suction port is provided on the side of said laser generator, a guide tube provided with discharge nozzle before laser beam reflection plate and said mixture with multi-component composite particles is sent through said nozzle of said high frequency plasma torch from said discharge nozzle.

16. A method for manufacturing composite vapor deposition film according to claim 1, wherein a ceramic, glass, metal, or composite material are used as the material for said deposition substrate.

17. A method for manufacturing composite vapor deposition film according to claim 1, wherein said deposition substrate is rotated.

* * * * *